US006214715B1

(12) United States Patent
Huang et al.

(10) Patent No.: US 6,214,715 B1
(45) Date of Patent: Apr. 10, 2001

(54) METHOD FOR FABRICATING A SELF ALIGNED CONTACT WHICH ELIMINATES THE KEY HOLE PROBLEM USING A TWO STEP SPACER DEPOSITION

(75) Inventors: Kuo-Ching Huang, Kaohsiung; Tse-Liang Ying; Wen-Chuan Chiang, both of Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/349,841

(22) Filed: Jul. 8, 1999

(51) Int. Cl.[7] .................................................. H01L 21/44
(52) U.S. Cl. ...................... 438/597; 438/700; 438/639; 438/640
(58) Field of Search ...................... 438/700, 701, 438/639, 696, 640, 634, 597

(56) References Cited

U.S. PATENT DOCUMENTS

| 5,208,472 | 5/1993 | Su et al. ............... 257/344 |
| 5,296,092 | 3/1994 | Kim ....................... 156/643 |
| 5,405,791 | * 4/1995 | Ahmad et al. . |
| 5,747,373 | * 5/1998 | Yu ......................... 438/305 |
| 5,789,314 | 8/1998 | Yen et al. ............... 438/622 |
| 5,824,588 | * 10/1998 | Liu ......................... 438/302 |
| 5,827,782 | 10/1998 | Shih ....................... 438/697 |
| 6,040,223 | * 10/1998 | Liu et al. ............... 438/303 |

* cited by examiner

Primary Examiner—Caridad Everhart
(74) Attorney, Agent, or Firm—George O. Saile; Stephen B. Ackerman; William J. Stoffel (57) ABSTRACT

This invention provides a method for forming a self aligned contact without key holes using a two step sidewall spacer deposition. The process begins by providing a semiconductor structure having a device layer, a first inter poly oxide layer (IPO-1), and a conductive structure (such as a bit line) thereover, and having a contact area on the device layer adjacent to the conductive structure. The semiconductor structure can further include an optional etch stop layer overlying the first inter poly oxide layer. The conductive structure comprises at least one conductive layer with a hard mask thereover. A first spacer layer is formed over the hard mask and the IPO-1 layer and anisotropically etched to form first sidewall spacers on the sidewalls of the conductive structure up to a level above the bottom of the hard mask and below the level of the top of the hard mask such that the profile of the first sidewall spacers are not concave at any point. A second spacer layer is formed over the first sidewall spacers and anisotropically etched to form second sidewall spacers, having a profile that is not concave at any point. A second inter poly oxide layer is formed over the second sidewall spacers, the hard mask, and the IPO-1 layer, whereby the second inter poly oxide layer is free from key holes. A contact opening is formed in the second inter poly oxide layer and the first inter poly oxide layer over the contact area. A contact plug is formed in the contact openings.

16 Claims, 9 Drawing Sheets

METHOD FOR FABRICATING A SELF ALIGNED CONTACT WHICH ELIMINATES THE KEY HOLE PROBLEM USING A TWO STEP SPACER DEPOSITION

BACKGROUND OF THE INVENTION

1) Field of the Invention

This invention relates generally to fabrication of semiconductor devices and more particularly to a two step process for forming spacers in a self aligned contact process which eliminates the key hole problem in the IPO (inter-poly oxide) layer.

2) Description of the Prior Art

The use of self aligned contact (SAC) processes has resulted in higher performing, lower cost, and increased density semiconductor devices. A self aligned contact process spacers are formed on the sidewalls of conductive structures (such as gates and bit lines); and IPO layer is formed over these conductive structures; a contact opening is etched through the IPO; and a conductive layer is formed over the conductive structures and in the contact opening. However, as device dimensions and die sizes continue to decrease for higher density, the space between adjacent conductive structures becomes narrower. The surface of the sidewall spacers facing the contact opening become concave (overhang) which leads to voids or key holes in the subsequently formed IPO layer. The key holes can cause two separate devices (such as capacitors) which are formed over the IPO layer to short, resulting in cell failure.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,747,373 (Yu) shows a method of forming a first SiN spacer and a second oxide spacer.

U.S. Pat. No. 5,208,472 (Su et al.) shows a double dielectric spacer. The first is oxide and the second is of a dielectric material.

U.S. Pat. No. 5,827,782 (Shih) shows a method of optimizing an IMD spacer layer profile.

U.S. Pat. No. 5,789,314 (Yen et al.) shows an IMD layer method with an etchback of an oxide layer.

U.S. Pat. No. 5,296,092 (Kim) teaches a planarization method where an upper portion of the oxide layer is etched back.

SUMMARY OF THE INVENTION

It is an object of the present invention to provide a method for fabricating a self aligned contact using a two-step spacer deposition.

It is another object of the present invention to provide a method for forming a self aligned contact which avoids the key hole problem by improving the sidewall spacer profile using a two-step spacer deposition.

It is another object of the present invention to provide a method for forming a self aligned contact which avoids capacitor crown to crown shorting by using a two-step spacer deposition.

It is yet another object of the present invention to provide a method for forming a self aligned contact using a two-step spacer deposition which is easy to integrate with current processes.

To accomplish the above objectives, the present invention provides a method for forming a self aligned contact without key holes using a two step sidewall spacer deposition. The process begins by providing a semiconductor structure having a first device layer over the semiconductor structure, a first inter-polysilicon oxide layer (IPO-1) over the first device layer, and a conductive structure (such as a bit line) with sidewalls on the IPO-1 layer and having a contact area on the semiconductor structure adjacent to the conductive structure. The conductive structure comprises at least one conductive layer with a hard mask thereover. A thin first spacer layer is formed over the hard mask and the semiconductor structure and anisotropically etched to form first sidewall spacers having a profile that is not concave at any point on the sidewalls of the conductive structure up to a level above the bottom of the hard mask and below the level of the top of the hard mask. A second spacer layer is formed over the first sidewall spacers and anisotropically etched to form second sidewall spacers, having a profile that is not concave at any point. A second inter poly oxide layer (IPO-2) is formed over the second sidewall spacers, the hard mask, and the semiconductor structure, whereby the IPO-2 layer is free from key holes. A contact opening is formed in the IPO-1 layer and the IPO-2 layer over the contact area. A contact plug is formed in the contact opening.

The present invention provides considerable improvement over the prior art. Most significantly, the profile of the sidewall spacers are controlled so that they do not become concave at any point. Because the first sidewall spacer layer is thinner than a spacer in a single spacer process, a concave (overhead) profile does not form. When the second spacer layer is formed, it is formed over the convex first spacer profile and it also is free from the overhead problem. This profile control prevents the formation of voids or key holes in the subsequently formed IPO-2 layer.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 2A, 3A, 4A, 5A & 6A are taken along axis 2A—2A. FIGS. 2B, 3B, 4B, 5B, 6B & 7 are taken along axis 2B—2B.

FIGS. 8A, 9A, 10A, 11A, 12A & 13A are taken along axis 2A—2A. FIGS. 8B, 9B, 10B, 11, 12B, 13B & 14 are taken along axis 2B—2B.

FIGS. 15A & 16A are taken along axis 2A—2A. FIGS. 15B & 16B are taken along axis 2B—2B.

DETAILED DESCRIPTION OF THE INVENTION

The present invention will be described in detail with reference to the accompanying drawings. The present invention provides a method for forming a self aligned contact without key holes in the second inter poly oxide (IPO-2) layer (50) using a two step sidewall spacer deposition. While double dielectric spacers are known in the art, the two step sidewall spacer deposition according to the present invention including a novel thin, reduced height first sidewall spacer provides the unexpected result of controlling the profile of the second sidewall spacer, thereby preventing the key hole problem.

Keyhole Problem that the Invention Solves

FIGS. 1 through 7 show a process known by the inventors that causes keyhole problems.

Figure 1:
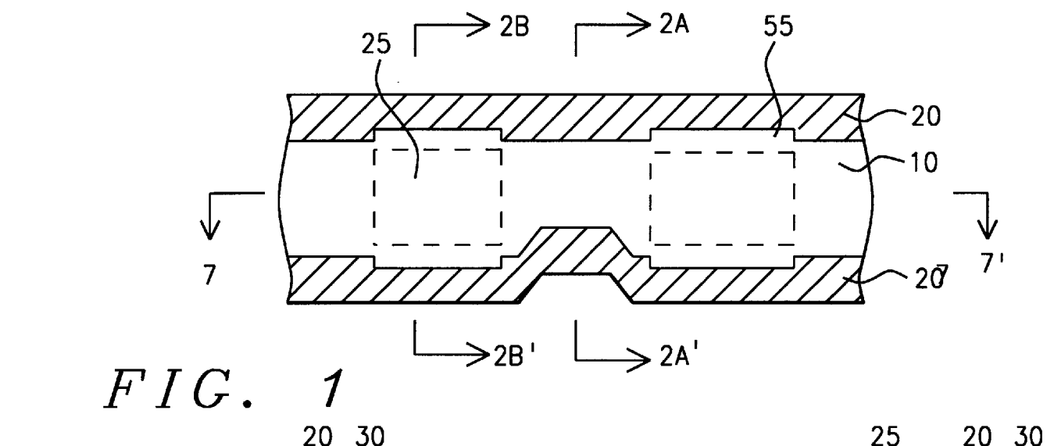
FIG. 1 shows a top view of a using self aligned contacts.

Referring to FIG. 1, the process begins by providing a semiconductor structure (7) for a semiconductor device, such as for a DRAM device. The semiconductor structure (7) can have, sequentially, a first device layer (e.g. poly-2) (8) and a first inter polysilicon oxide (e.g. IPO-1) layer (9) thereover. Semiconductor structure (7) is understood to possibly further include active and passive devices formed within the substrate, additional conductive layers (e.g. polysilicon or metal), and/or additional insulating layers (e.g. inter poly oxide (IPO), inter metal dielectric (IMD), etc) formed over the substrate surface. The term "semiconductor structure" is meant to include devices formed within a semiconductor substrate and the layers overlying the substrate.

The first IPO-1 layer (9) has conductive structures (20) thereover. The conductive structures (20) are preferably lines (such as a bit lines) comprising a polysilicon layer (21) with a tungsten silicide layer (22) thereover as shown in FIG. 2B. The conductive structures (20) are spaced apart a distance of between about 0.05 microns and 0.5 microns in a narrow area which is not over the contact area. A hard mask (30) is located on the top of the tungsten silicide layer (22). The hard mask is preferably composed of silicon nitride. The conductive structure (20) has sidewalls and a top. A contact area (25) is located on the first device layer (8) adjacent to the conductive structure (20). As shown in FIGS. 1 and 2B, a conductive device (55), such as a capacitor crown, may be formed over a contact area (25) during subsequent processing.

Figure 2A:
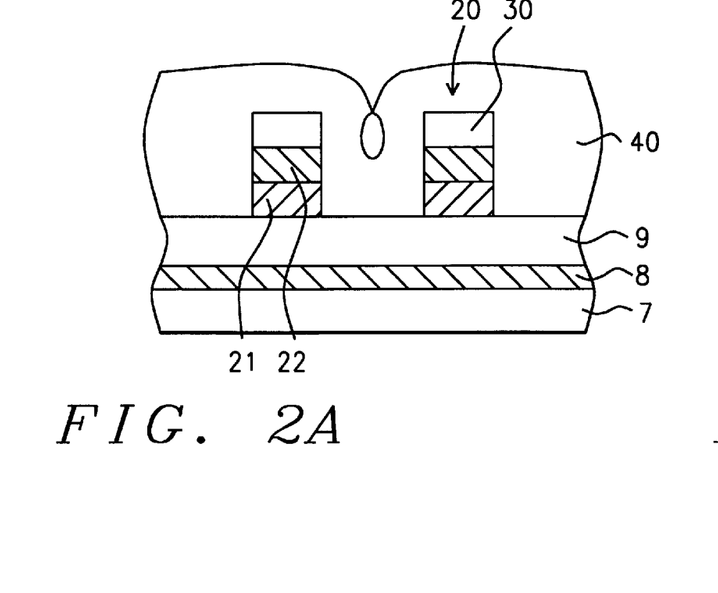
FIGS. 2A, 2B, 3A, 3B, 4A, 4B, 5A, 5B, 6A, 6B & 7 illustrate sequential sectional views of a current process for fabrication of a self aligned contact.
Figure 2B:
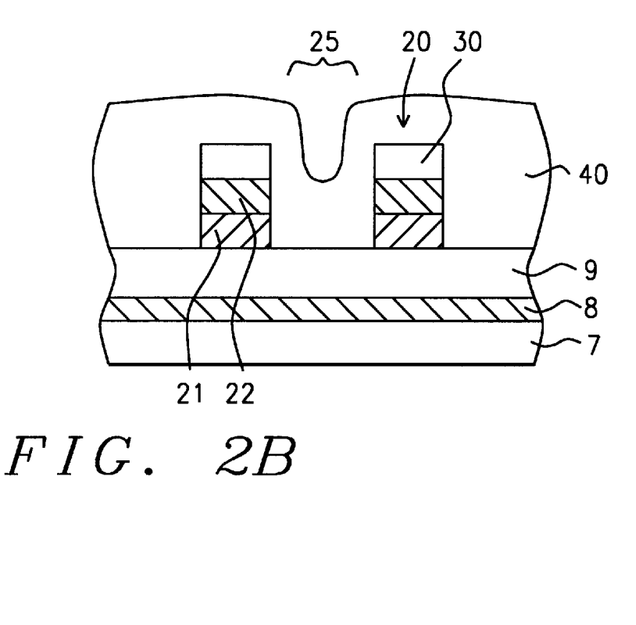

Referring to FIGS. 2A & 2B, in the problem process, a sidewall spacer layer (40) is formed over the hard mask (30) and the IPO-1 layer (9). The sidewall spacer layer (40) is composed of silicon nitride formed to a thickness of between about 1500 Angstroms and 3000 Angstroms using plasma enhanced chemical vapor deposition (PECVD). Since the step coverage of PECVD silicon nitride is poor, the over-head problem (concave profile) occurs. The over-head problem causes a keyhole to develop following subsequent IPO-2 deposition.

Figure 3A:
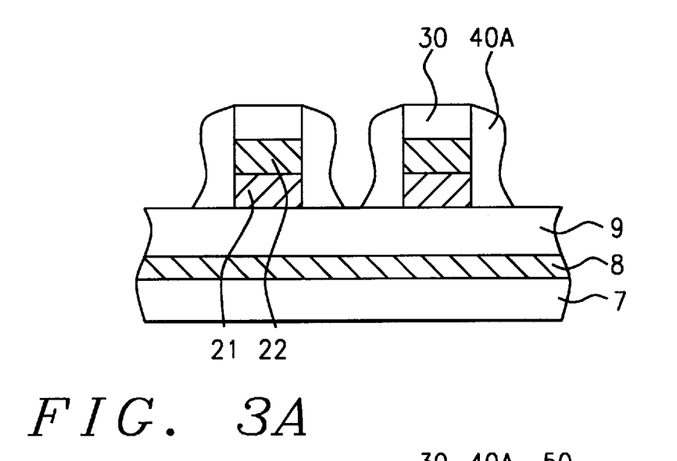
Figure 3B:
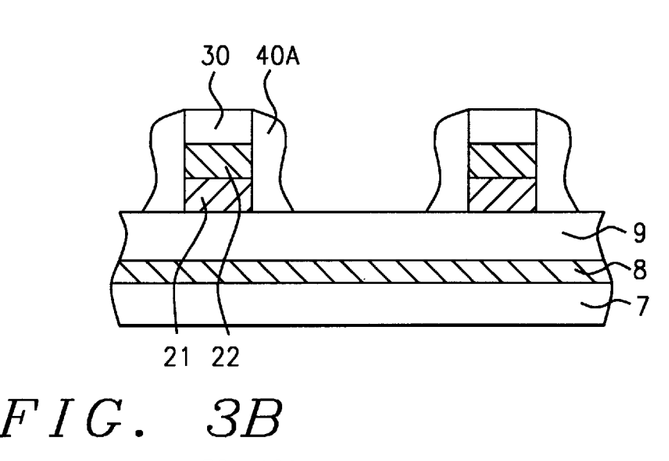

Referring to FIGS. 3A & 3B, the sidewall spacer layer (40) is etched using an anisotropic dry etch to form sidewall spacers (40A) on the sidewalls of the conductive structures (20). The sidewall spacers (40A) formed by the current process have a thickness of between about 1500 Angstroms and 3000 Angstroms. The surface of the sidewall spacers (40A) opposite the conductive structure (20) can have a concave profile (e.g. undercut, over-head) as shown in FIG. 3B. This concave profile is the result of etching the over-head sidewall spacer layer (40) discussed previously, and will induce the keyhole in the IPO-2 layer.

Figure 4A:
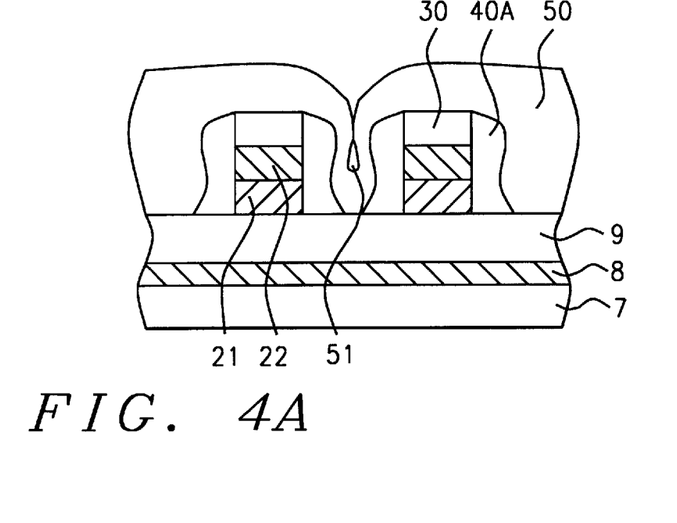
Figure 4B:
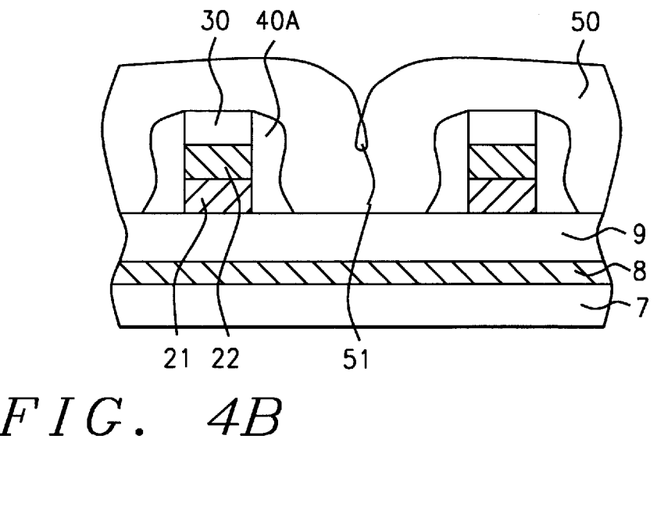

Referring to FIGS. 4A & 4B, a second inter poly oxide layer (50) (IPO-2) is formed over the sidewall spacers (40A), the conductive structure (20), and the IPO-1 layer (9). The IPO-2 layer (50) is preferably formed using low temperature PECVD process. As shown in FIGS. 4A & 4B, the concave profile of the sidewall spacers (40A) causes a void (or key hole) (51) in the IPO-2 layer (50).

Figure 5A:
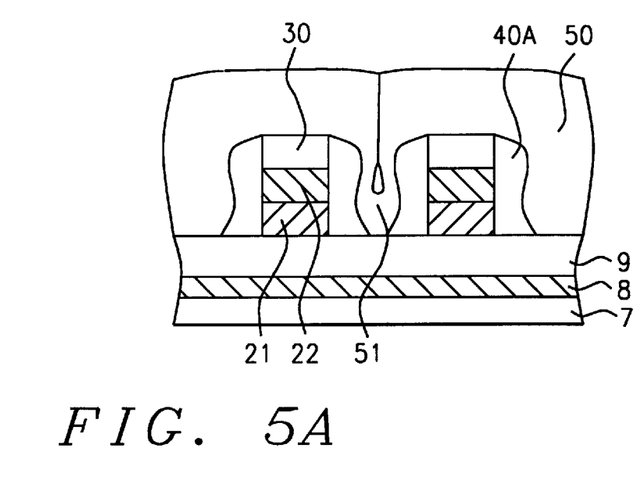
Figure 5B:
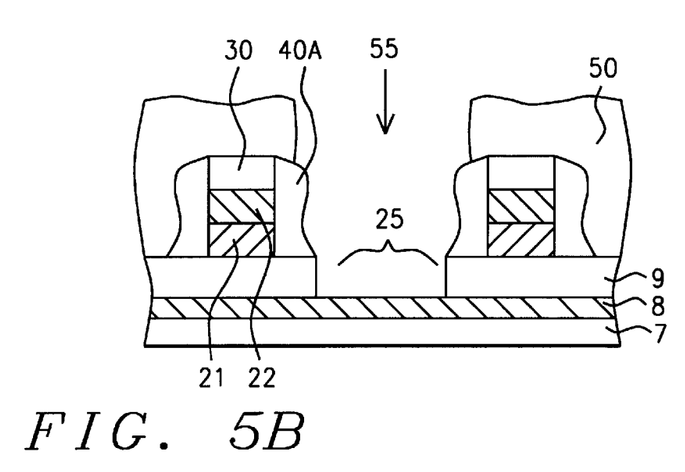

Referring to FIGS. 5A & 5B, a contact opening (55) is formed in the IPO-1 layer (9) and the IPO-2 layer (50) over the contact area (25) using photolithography and etching. As shown in FIG. 5A, the key hole (51) remains between the conductive structures (20) in the IPO layer (50) where it is not over the contact area (25).

Figure 6A:
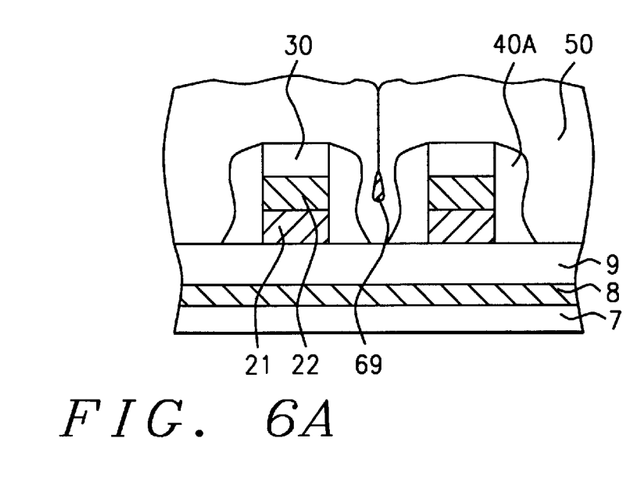
Figure 6B:
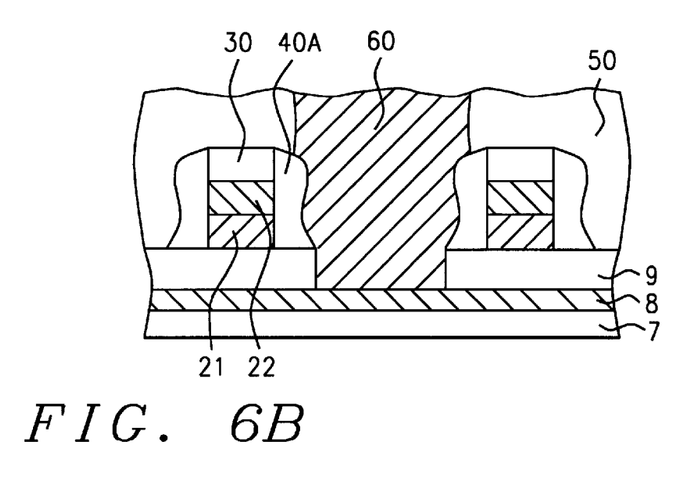

Referring to FIGS. 6A & 6B, a contact (e.g. SAC-2) (60) is formed in the contact opening (55). The contact (60) is composed of a conductive material, preferably polysilicon. A key disadvantage of the current process is that the conductive material for the contact (60) can get into the key hole (51) in the IPO layer (50) causing a conductive path (69) and an electrical short between devices such as crown capacitors formed over adjacent contacts.

Figure 7:
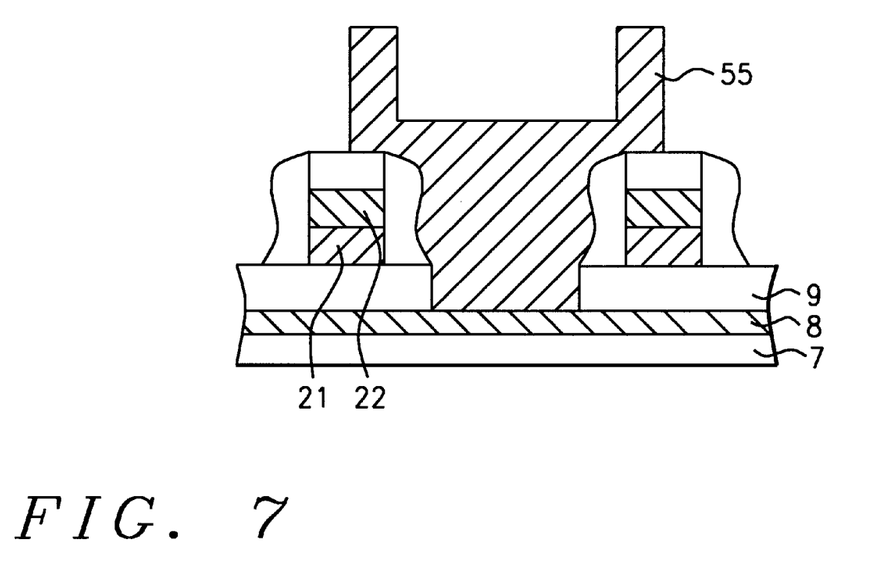

Referring to FIG. 7, a conductive device (55) such as a capacitor crown, can be formed by patterning the contact (60) using processes known in the art.

First Preferred Embodiment—First (SiO) and Second (SiN) Sidewall Spacers

In the first preferred embodiment of the invention, first sidewall spacers (42A) are composed of silicon oxide and second sidewall spacers (44A) are composed of silicon nitride as shown in FIGS. 8A through 14.

Figure 8A:
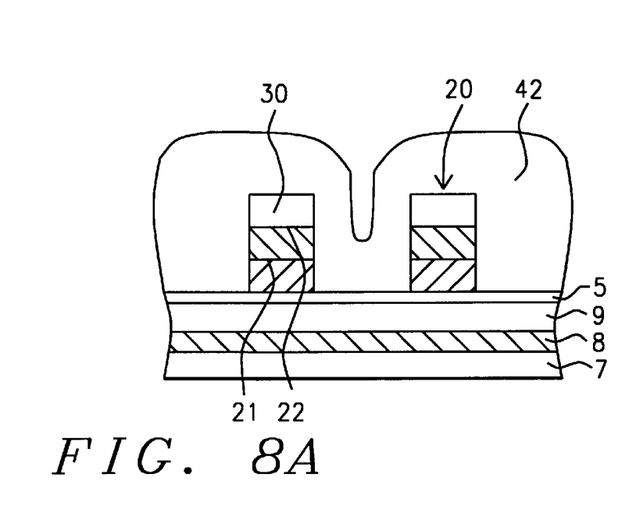
FIGS. 8A, 8B, 9A, 9B, 10A, 10B, 11A, 11B, 12A, 12B, 13A, 13B & 14 illustrate sequential sectional views of a process for fabrication of a self aligned contact without key holes according to the invention.
Figure 8B:
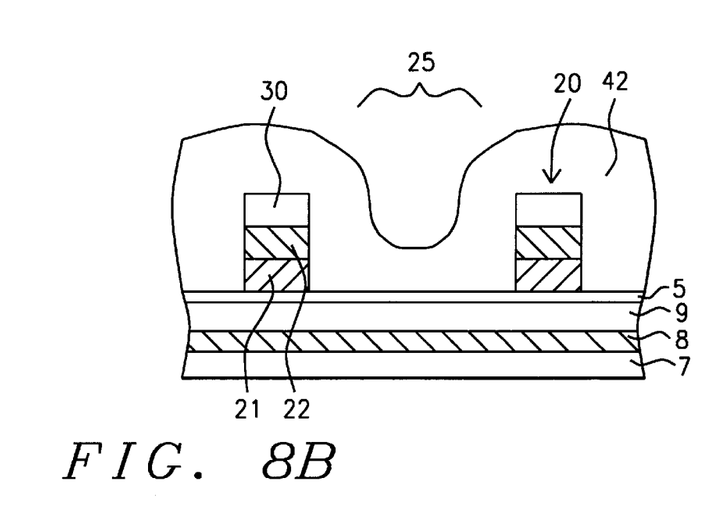

Referring to FIGS. 8A & 8B, the first preferred embodiment begins by providing a semiconductor structure (7) for a semiconductor device, such as for a DRAM device. The semiconductor structure (7) has a first device layer (e.g. poly-2) (8) thereover and a first inter polysilicon oxide (IPO-1) layer (9) over the first device layer (8). The IPO-1 layer (9) has conductive structures (20) thereover. The conductive structures (20) are preferably lines (such as bit lines) comprising a polysilicon layer (21) with a tungsten silicide layer (22) thereover as shown in FIG. 8B. The conductive structures (20) are spaced apart a distance of between about 0.05 microns and 0.5 microns in a narrow area which is not over the contact area.

The semiconductor structure can further comprise an optional etch stop layer (5) on the IPO-1 layer (9). The optional etch stop layer (5) can be composed of silicon nitride or silicon oxynitride and preferably has a thickness of between about 50 Angstroms and 200 Angstroms.

A hard mask (30) is located on the top of the tungsten silicide layer (22). The hard mask is preferably composed of silicon nitride having a thickness of between about 1000 Angstroms and 3000 Angstroms. The conductive structure (20) has sidewalls and a top. A contact area (25) is located on the first device layer (8) adjacent to the conductive structure (20).

Still referring to FIGS. 8A & 8B, a first spacer layer (42) composed of silicon oxide is formed over the hard mask (30) and the IPO-1 layer (9). The first sidewall spacer layer (42) is preferably formed using a plasma enhanced chemical vapor deposition process at a temperature of between about 400° C. and 500° C. The first sidewall spacer layer (42) is preferably formed to a thickness of between about 500 Angstroms and 1000 Angstroms.

Figure 9A:
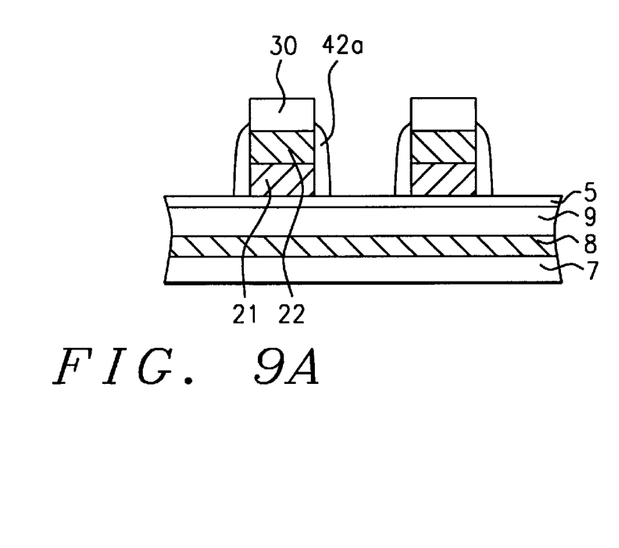
Figure 9B:
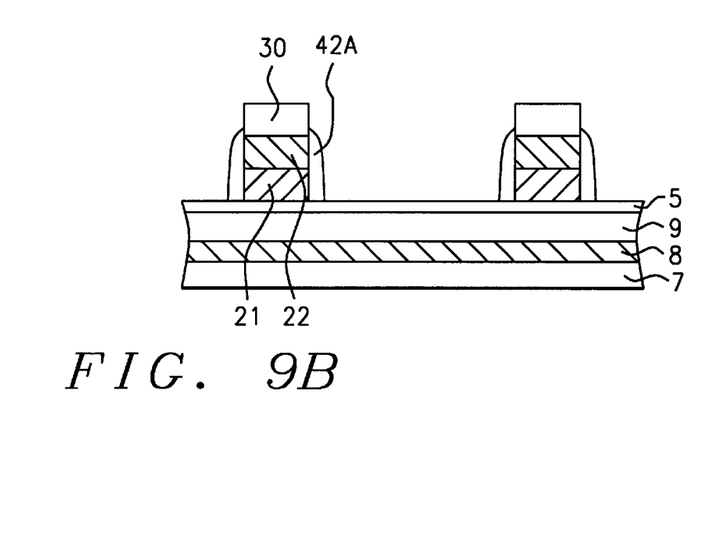

Referring to FIGS. 9A & 9B, the first spacer layer (42) is anisotropically etched to form first sidewall spacers (42A). The etch is performed using reactive ion etching with a chemistry selective to silicon nitride to prevent overetching of the hard mask (30). For example the etch chemistry could include $CHF_3$ and $O_2$ at low $O_2$ flow rate (i.e. less than 5% $O_2$ by volume).

A key aspect of the invention is the extent that the first spacer layer (42) is etched to form the first sidewall spacers (42A). The extent of this etch controls the ultimate profile of the second sidewall spacers (44A). This profile is responsible for eliminating key holes in the subsequently formed IPO-2 layer (50). The first sidewall spacer layer (42) is etched sufficiently to form first sidewall spacers (42A) on the sidewalls of the conductive structure (20) which extend up to a level above the bottom of the hard mask (30) and below the level of the top of the hard mask (30), preferably to a level between 800 Angstroms and 1500 Angstroms above the level of the bottom of the hard mask (30). The first sidewall spacers (42A) preferably have a thickness of between about 800 Angstroms and 1500 Angstroms at the top surface of the IPO-1 layer (9). In the present invention, the first sidewall spacers (42A) are not concave at any point.

Figure 10A:
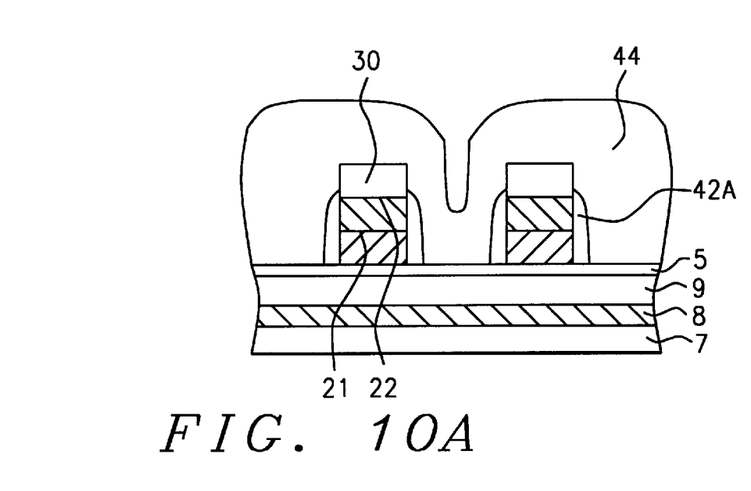
Figure 10B:
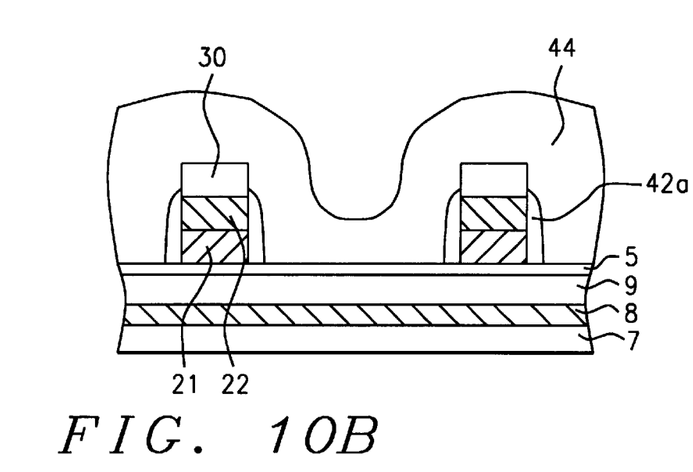

Referring to FIGS. 10A & 10B, a second sidewall spacer layer (44) composed of silicon nitride is formed over the first sidewall spacers (42A), the IPO-1 layer (9), and the hard mask (30). The second sidewall spacer layer (44) is preferably formed by plasma enhanced chemical vapor deposition, and has a thickness of between about 500 Angstroms and 1500 Angstroms.

Figure 11A:
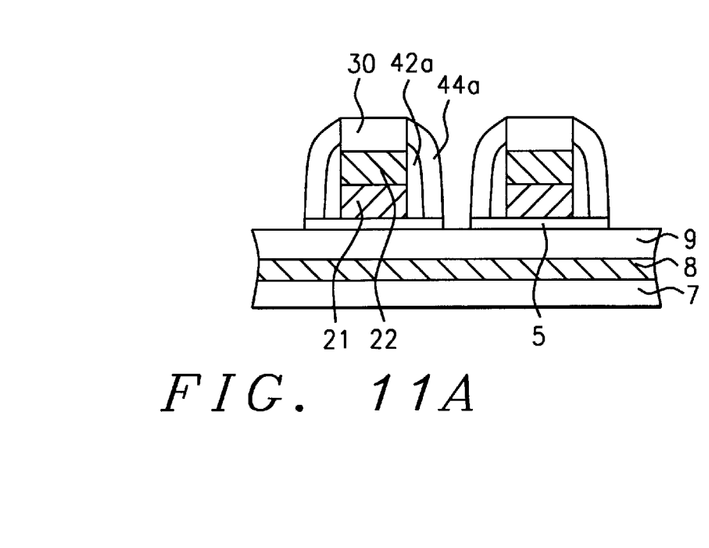
Figure 11B:
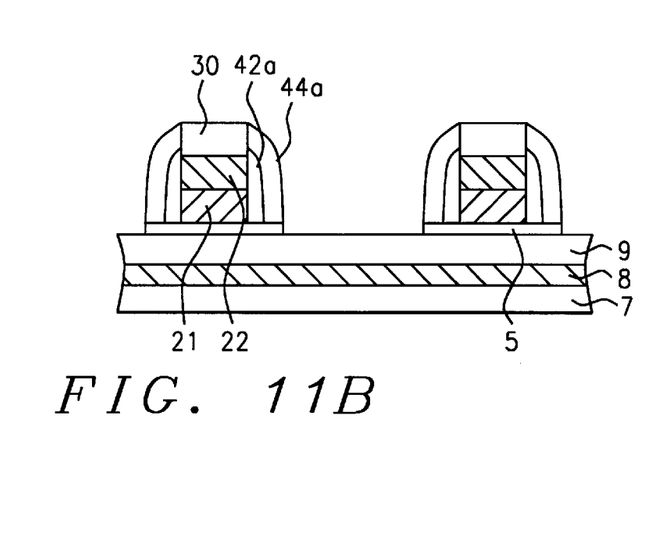

Referring to FIGS. 11A & 11B, the second sidewall spacer layer (44) is anisotropically etching to form second sidewall spacers (44A). The second sidewall spacer layer is etched using $O_2$ and $CF_4$ in an anisotropic etching process. The second sidewall spacers (44A) have a thickness of between about 500 Angstroms and 1500 Angstroms. The profile of the second sidewall spacers (44A) is not concave at any point. If present, the optional etch stop layer (5) acts as an etch stop during the second sidewall spacer (44A) etch step.

Figure 12A:
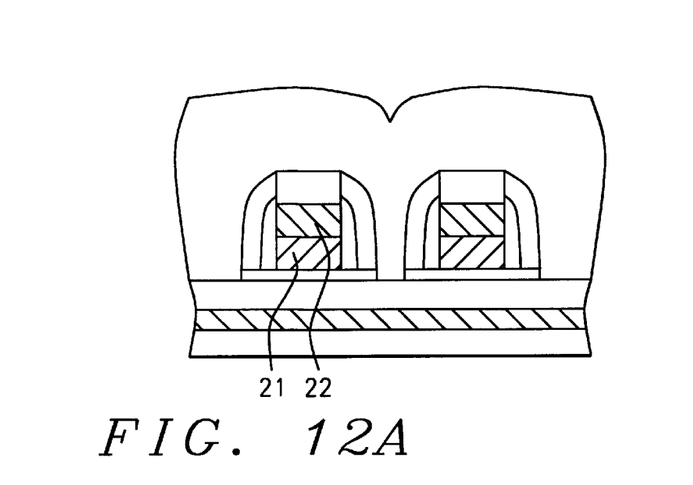
Figure 12B:
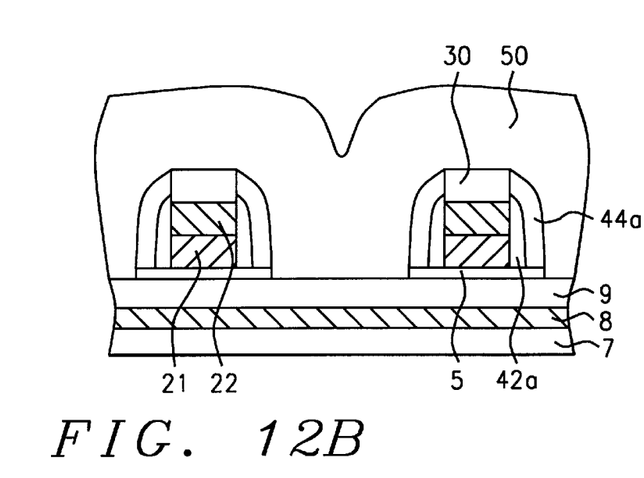

Referring to FIGS. 12A & 12B, a second inter poly oxide (IPO-2) layer (50) is formed over the second sidewall spacers (44A), the hard mask (30), and the IPO-1 layer (9). The IPO-2 layer (50) can be formed by chemical vapor deposition using TEOS as a reactant, or more preferably by plasma enhanced chemical vapor deposition (PECVD). Since the surface of the second sidewall spacers (44A) are not concave, the IPO-2 layer (50) is free from key holes.

Figure 13A:
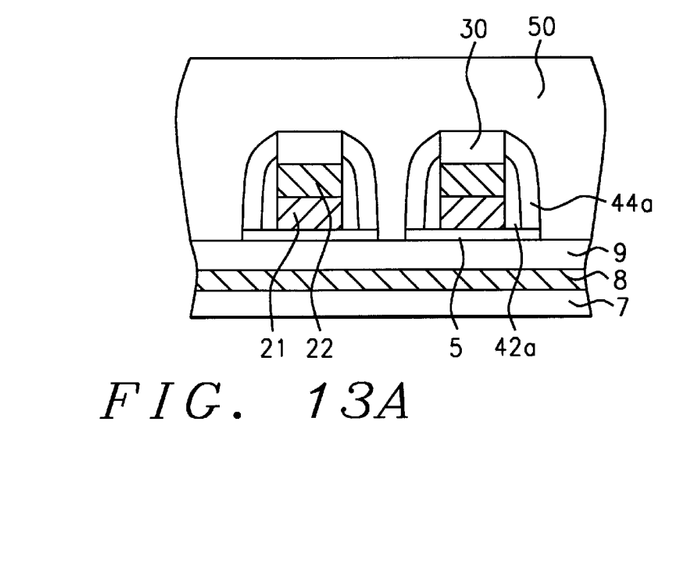
Figure 13B:
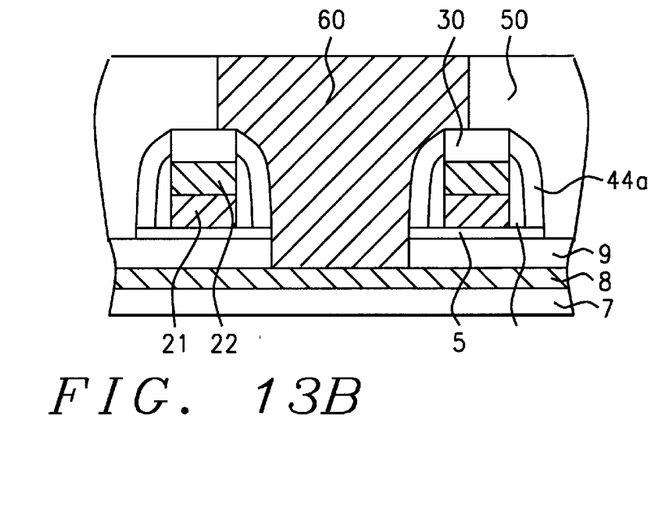

Referring to FIGS. 13A & 13B, a contact opening (55) is formed in the IPO-1 layer (9) and the IPO-2 layer (50) over the contact area (25) using photolithography and an anisotropic etch. The contact opening preferably has a width of between about 0.05 microns and 0.5 microns. A contact plug (60) is formed in the contact opening (55) in the IPO-1 layer (9) and the IPO-2 layer (50). The contact plug (60) is preferably composed of polysilicon which can be doped in-situ.

Figure 14:
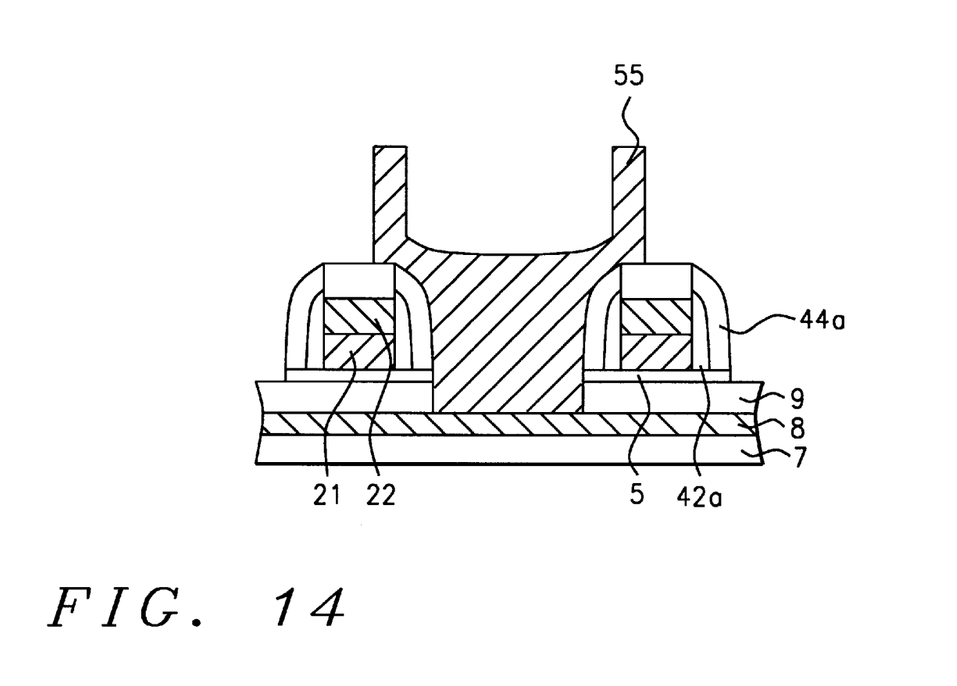

Referring to FIG. 14, a conductive device (55) such as a capacitor crown, can be formed by patterning the contact (60) using processes known in the art.

Second Embodiment SiN First and Second Spacers

In an alternate embodiment of the invention, the first sidewall spacers (42A) and the second sidewall spacers (44A) are composed of silicon nitride. To prevent overetching of the hard mask during etching of the first sidewall spacer layer (42) to form the first sidewall spacers (42A), the hard mask is comprises a silicon nitride layer (31) with a silicon oxide layer (32) thereover.

Figure 15A:
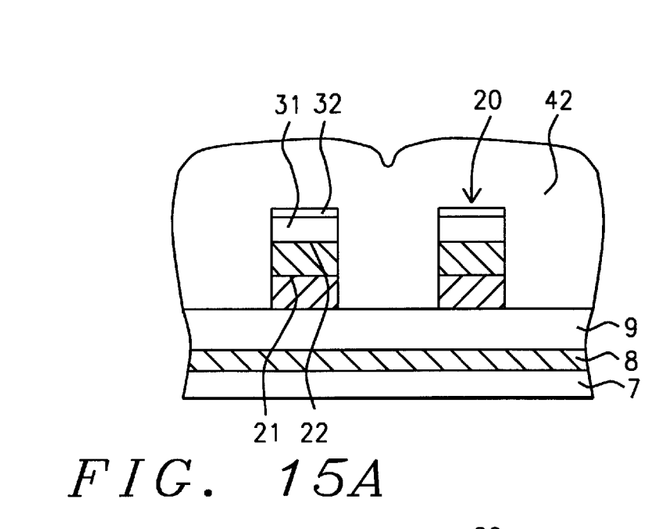
FIGS. 15A, 15B, 16A & 16B illustrate sequential sectional views of an alternate embodiment of a process for fabrication of a self aligned contact without key holes according to the invention.
Figure 15B:
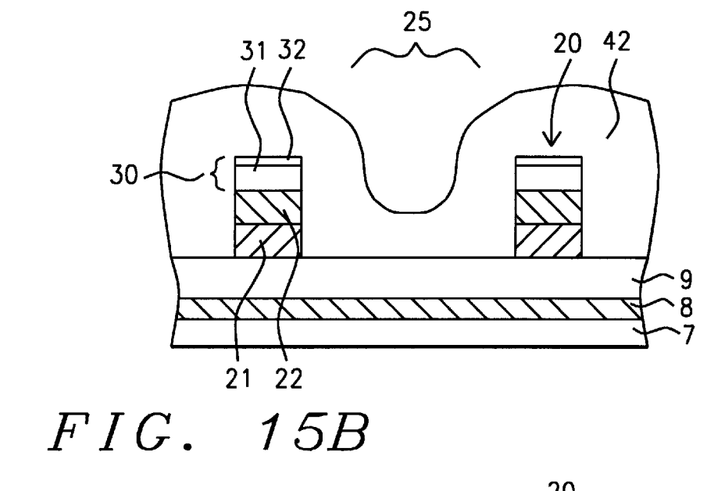

Referring to FIGS. 15A & 15B, the second preferred embodiment begins by providing a semiconductor structure (7) with a first device layer (8), a first interpolysilicon oxide layer (IPO-1) (9), and conductive structures (20) thereover, which are the same as the semiconductor structure (7), the first device layer (8), the first interpolysilicon oxide layer (IPO-1) (9),and the conductive structures (20) of the first embodiment in all respects. Like the semiconductor structure of the first embodiment, the semiconductor structure of the second embodiment can further comprise an etch stop layer (5) on the IPO-1 layer (9).

A hard mask (30) is formed on the conductive structures (20). The hard mask is preferably comprises a silicon nitride layer (31) having a thickness of between about 100 Angstroms and 500 Angstroms and a silicon oxide layer (32) having a thickness of between about 100 Angstroms and 500 Angstroms overlying the silicon nitride layer (31). The conductive structures (20) have sidewalls and tops. A contact area (25) is located on the first device layer (8) adjacent to the conductive structures (20).

Still referring to FIGS. 15A & 15B, a first spacer layer (42) composed of silicon nitride is formed over the hard mask (30) and the IPO-1 layer (9). The first sidewall spacer layer (42) is preferably formed to a thickness of between about 500 Angstroms and 1000 Angstroms using a plasma enhanced chemical vapor deposition (PECVD) process.

Figure 16A:
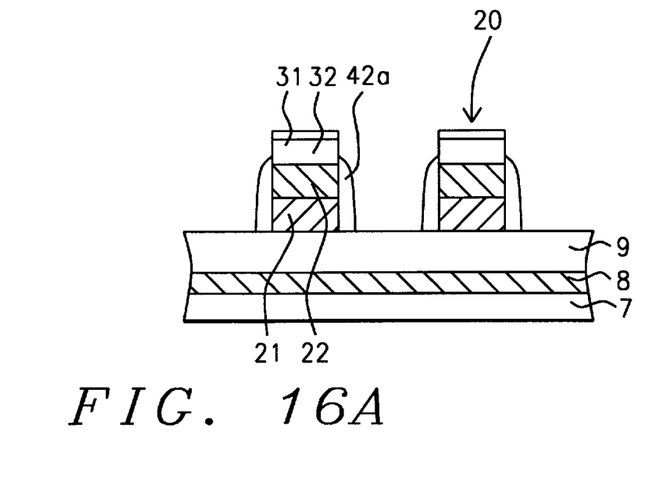
Figure 16B:
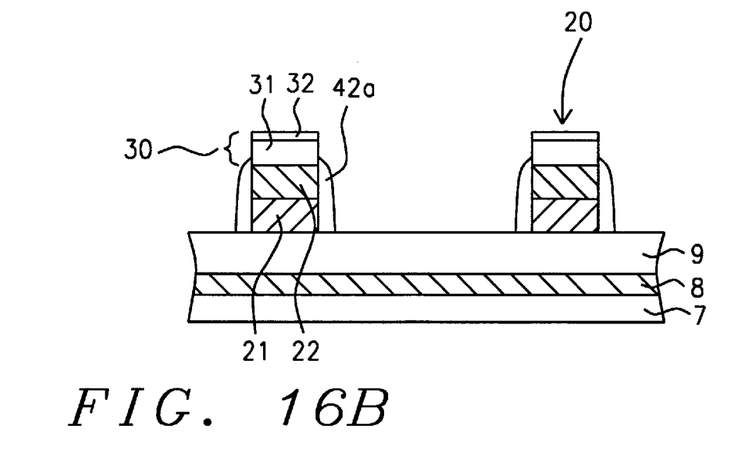

Referring to FIGS. 16A & 16B, the first sidewall spacer layer (42) is etched using $O_2$ and $CF_4$ in an anisotropic etch process to form first sidewall spacers (42A).

As with the first embodiment, the extent of this etch controls the ultimate profile of the second sidewall spacers (44A). This profile is responsible for eliminating key holes in the subsequently formed IPO-2 layer (50). The first sidewall spacer layer (42) is etched sufficiently to form first sidewall spacers (42A) on the sidewalls of the conductive structure (20) which extend up to a level above the bottom of the hard mask (30) and below the level of the top of the hard mask (30), preferably to a level between 800 Angstroms and 1500 Angstroms above the level of the bottom of the hard mask (30). The first sidewall spacers (42A) preferably have a thickness of between about 800 Angstroms and 1500 Angstroms at the top surface of the IPO-1 layer (9). In the present invention, the first sidewall spacers (42A) are not concave at any point.

The process of the second embodiment continues in the same manner as the process of the first embodiment following the formation of the first sidewall spacers, described above and shown in FIGS. 10A through 14.

While the invention has been particularly shown and described with reference to the preferred embodiments thereof, it will be understood by those skilled in the art that various changes in form and details may be made without departing from the spirit and scope of the invention.

What is claimed is:

1. A method for forming a self aligned contact, comprising the steps of:

a. providing a semiconductor structure having a first device layer over said semiconductor structure, a first inter poly oxide layer over said first device layer, and a hard mask layer over said inter poly oxide layer; said semiconductor structure having a conductive structure thereover with sidewalls; said first device layer having a contact area thereon adjacent to said conductive structure;

b. forming a first spacer layer over said hard mask and said first inter polysilicon oxide layer;

c. anisotropically etching said first spacer layer to form first sidewall spacers on said sidewalls of said conductive structure up to a level above the bottom of said hard mask and below the level of the top of said hard mask;

d. forming a second spacer layer over said first sidewall spacers, said first inter polysilicon oxide layer, and said hard mask;

e. anisotropically etching said second sidewall spacer layer to form second sidewall spacers; whereby the profile of said second sidewall spacers is not concave at any point;

f. forming a second inter poly oxide layer over said second sidewall spacers, said hard mask, and said semiconductor structure; whereby said second inter poly oxide layer is free from key holes;

g. forming a contact opening in said second inter poly oxide layer and said first inter poly oxide layer over said contact area; and h. forming a contact plug in said contact opening.

2. The method of claim 1 wherein said hardmask has a thickness of between about 1000 Angstroms and 3000 Angstroms, and the top of said first sidewall spacer is at a level between about 800 Angstroms and 1500 Angstroms above the bottom of said hard mask.

3. The method of claim 1 wherein said conductive structure is a line comprising a polysilicon layer with a tungsten silicide layer overlying said polysilicon layer and a silicon nitride hard mask overlying said tungsten silicide layer.

4. The method of claim 1 wherein said first sidewall spacer is composed of silicon oxide and has a thickness of between about 800 Angstroms and 1500 Angstroms and said second sidewall spacer is composed of silicon nitride and has a thickness of between about 500 Angstroms and 1500 Angstroms.

5. The method of claim 1 wherein said first sidewall spacer is composed of silicon nitride and has a thickness of between about 800 Angstroms and 1500 Angstroms and said second sidewall spacer is composed of silicon nitride and has a thickness of between about 500 Angstroms and 1500 Angstroms.

6. The method of claim 1 wherein said semiconductor structure further comprises an etch stop layer composed of silicon oxide or silicon nitride overlying said first inter poly oxide layer.

7. A method for forming a self aligned contact without key holes, comprising the steps of:

a. providing a semiconductor structure having a first device layer over said semiconductor structure, a first inter poly oxide layer over said first device layer, and an etch stop layer over said first inter poly oxide layer; said semiconductor structure having thereon a conductive structure with sidewalls; said first device layer having a contact area adjacent to said conductive structure; said conductive structure comprising at least one conductive layer with a hard mask composed of silicon nitride thereover;

b. forming a first spacer layer composed of silicon oxide and having a thickness of between about 500 Angstroms and 1000 Angstroms over said hard mask and said first inter polysilicon oxide layer;

c. anisotropically etching said first spacer layer to form first sidewall spacers on said sidewalls of said conductive structure up to a level above the bottom of said hard mask and below the level of the top of said hard mask; whereby the profile of said first sidewall spacers is not concave at any point;

d. forming a second spacer layer composed of silicon nitride and having a thickness of between about 500 Angstroms and 1500 Angstroms over said first sidewall spacers, said first inter polysilicon oxide layer, and said hard mask;

e. anisotropically etching said second sidewall spacer layer to form second sidewall spacers; whereby the profile of said second sidewall spacers is not concave at any point;

f. forming a second inter poly oxide layer over said second sidewall spacers, said hard mask, and said first inter polysilicon oxide layer; whereby said second inter poly oxide layer is free from key holes;

g. forming a contact opening in said first inter poly oxide layer and said second inter poly oxide layer over said contact area; and h. forming a contact plug in said contact opening.

8. The method of claim 7 wherein said hardmask has a thickness of between about 1000 Angstroms and 3000 Angstroms, and the top of said first sidewall spacer is at a level between about 800 Angstroms and 1500 Angstroms above the bottom of said hard mask.

9. The method of claim 7 wherein said conductive structure is a line comprising a polysilicon layer with a tungsten silicide layer overlying said polysilicon layer and a silicon nitride hard mask overlying said tungsten silicide layer.

10. The method of claim 7 wherein said first sidewall spacer has a thickness of between about 800 Angstroms and 1500 Angstroms and said second sidewall spacer has a thickness of between about 500 Angstroms and 1500 Angstroms.

11. The method of claim 7 wherein said first sidewall spacer layer is etched using $CHF_3$ and $O_2$ in a reactive ion etch process having less than 5% $O_2$ by volume, and said second sidewall spacer layer is etched using $O_2$ and $CF_4$ in a reactive ion etch process.

12. A method for forming a self aligned contact without key holes, comprising the steps of:

a. providing a semiconductor structure having a first device layer over said semiconductor structure, a first inter poly oxide layer over said first device layer, and an etch stop layer over said first inter poly oxide layer; said semiconductor structure having thereon a conductive structure with sidewalls; said first device layer having a contact area adjacent to said conductive structure; said conductive structure comprising at least one conductive layer with a hard mask comprising a silicon nitride layer and a silicon oxide layer overlying said silicon nitride layer;

b. forming a first spacer layer composed of silicon nitride and having a thickness of between about 500 Angstroms and 1000 Angstroms over said hard mask and said first inter polysilicon oxide layer;

c. anisotropically etching said first spacer layer to form first sidewall spacers on said sidewalls of said conductive structure up to a level above the bottom of said hard mask and below the level of the top of said hard mask; whereby the profile of said first sidewall spacers is not concave at any point;

d. forming a second spacer layer composed of silicon nitride and having a thickness of between about 500 Angstroms and 1500 Angstroms over said first sidewall spacers, said first inter polysilicon oxide layer, and said hard mask;

e. anisotropically etching said second sidewall spacer layer to form second sidewall spacers; whereby the profile of said second sidewall spacers is not concave at any point;

f. forming a second inter poly oxide layer over said second sidewall spacers, said hard mask, and said first inter polysilicon oxide layer; whereby said second inter poly oxide layer is free from key holes;

g. forming a contact opening in said second inter poly oxide layer and said first inter poly oxide layer over said contact area; and h. forming a contact plug in said contact opening.

13. The method of claim 12 wherein said silicon nitride layer of said hardmask has a thickness of between about 100 Angstroms and 500 Angstroms; said silicon oxide layer of said hard mask has a thickness of between about 100 Angstroms and 500 Angstroms; and the top of said first sidewall spacer is at a level between about 800 Angstroms and 1500 Angstroms above the bottom of said hard mask.

14. The method of claim 12 wherein said conductive structure is a line comprising a polysilicon layer with a tungsten silicide layer overlying said polysilicon layer, and a hardmask comprising a silicon nitride layer overlying said tungsten silicide layer of said conductive line, and a silicon oxide layer overlying said silicon nitride layer.

15. The method of claim 12 wherein said first sidewall spacer has a thickness of between about 800 Angstroms and 1500 Angstroms and said second sidewall spacer has a thickness of between about 500 Angstroms and 1500 Angstroms.

16. The method of claim 12 wherein said first sidewall spacer layer and said second sidewall spacer layer are etched using $O_2$ and $CF_4$ in a reactive ion etch process.

* * * * *